(12) United States Patent
Lin et al.

(10) Patent No.: US 10,756,448 B2
(45) Date of Patent: Aug. 25, 2020

(54) CAMERA MODULE FACILITATING INDUSTRIALIZED ASSEMBLY LINE AND ELECTRONIC DEVICE WITH THE SAME

(71) Applicant: TRIPLE WIN TECHNOLOGY(SHENZHEN) CO. LTD., Shenzhen (CN)

(72) Inventors: Cheng-An Lin, New Taipei (TW); Chun-Yao Huang, New Taipei (TW)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/375,320

(22) Filed: Apr. 4, 2019

(65) Prior Publication Data

US 2020/0212603 A1 Jul. 2, 2020

(30) Foreign Application Priority Data

Jan. 2, 2019 (CN) .......................... 2019 1 0002560

(51) Int. Cl.
*H01R 4/04* (2006.01)
*H05K 1/18* (2006.01)
*H04N 5/225* (2006.01)

(52) U.S. Cl.
CPC ............. *H01R 4/04* (2013.01); *H04N 5/2253* (2013.01); *H04N 5/2254* (2013.01); *H05K 1/181* (2013.01); *H05K 2201/1009* (2013.01); *H05K 2201/1053* (2013.01); *H05K 2201/10121* (2013.01); *H05K 2201/10151* (2013.01); *H05K 2201/10378* (2013.01); *H05K 2201/10515* (2013.01)

(58) Field of Classification Search
CPC ...... H01R 4/04; H04N 5/2254; H04N 5/2253; H05K 1/181; H05K 2201/10515; H05K 2201/10378; H05K 2201/1009; H05K 2201/10121; H05K 2201/10151; H05K 2201/1053

See application file for complete search history.

(56) References Cited

U.S. PATENT DOCUMENTS 9,154,670 B1 * 10/2015 Peng .................... H04N 5/2171
9,185,280 B2 * 11/2015 Kim ..................... H04N 5/2257
(Continued)

FOREIGN PATENT DOCUMENTS

CN 105704354 A 6/2016

*Primary Examiner* — Timothy J Henn
(74) *Attorney, Agent, or Firm* — ScienBiziP, P.C.

(57) ABSTRACT

A camera module for facilitating industrialized water assembly includes a lens driver, a holder, a printed circuit board, and at least two conductive adhesives. The lens driver includes at least one pin. The lens driver is mounted on the holder. The pin extends from the lens driver to the holder. The holder includes at least one conductive layer corresponding to the pin. The conductive layer includes a first end and a second end opposite to the first end. The holder is mounted on the printed circuit board. One conductive adhesive connects the pin to the first end of the conductive layer, the other one conductive adhesive connects the second end of the conductive layer to the printed circuit board, that makes the conductive layer electrically connect to the printed circuit board.

16 Claims, 4 Drawing Sheets

(56) References Cited

U.S. PATENT DOCUMENTS

| | | | | |
|---|---|---|---|---|
| 2002/0057468 A1* | 5/2002 | Segawa | H04N 5/2253 | 358/509 |
| 2005/0035421 A1* | 2/2005 | Kayanuma | H01L 27/14618 | 257/432 |
| 2006/0189183 A1* | 8/2006 | Yang | H01R 13/5025 | 439/95 |
| 2007/0146534 A1* | 6/2007 | Kim | H04N 5/2257 | 348/340 |
| 2009/0051774 A1* | 2/2009 | Shiraishi | H04N 5/2251 | 348/207.99 |
| 2009/0079863 A1* | 3/2009 | Aoki | G02B 13/001 | 348/374 |
| 2009/0128681 A1* | 5/2009 | Kim | H04N 5/2253 | 348/335 |
| 2009/0278978 A1* | 11/2009 | Suzuki | G02B 7/08 | 348/345 |
| 2010/0085474 A1* | 4/2010 | Morita | H04N 5/2251 | 348/374 |
| 2010/0158508 A1* | 6/2010 | Kim | H04N 5/2253 | 396/529 |
| 2011/0130177 A1* | 6/2011 | Halliday | H01L 27/14618 | 455/575.1 |
| 2011/0157462 A1* | 6/2011 | Huang | H04N 5/2253 | 348/374 |
| 2013/0128100 A1* | 5/2013 | Son | H04N 5/2254 | 348/357 |
| 2013/0329106 A1* | 12/2013 | Bigioi | H04N 5/2254 | 348/308 |
| 2014/0002676 A1* | 1/2014 | Ning | H04N 5/23209 | 348/187 |
| 2014/0043519 A1* | 2/2014 | Azuma | G03B 3/10 | 348/345 |
| 2014/0063265 A1* | 3/2014 | Shukla | G03B 13/18 | 348/187 |
| 2015/0109526 A1* | 4/2015 | Lee | H04N 5/2257 | 348/374 |
| 2017/0363838 A1* | 12/2017 | Jeong | G02B 3/14 | |
| 2018/0136434 A1* | 5/2018 | Alasirnio | G03B 3/10 | |
| 2019/0179107 A1* | 6/2019 | Hsu | G02B 7/04 | |

\* cited by examiner

CAMERA MODULE FACILITATING INDUSTRIALIZED ASSEMBLY LINE AND ELECTRONIC DEVICE WITH THE SAME

FIELD

The subject matter of the application generally relates to a camera module facilitating industrialized assembly line and an electronic device with the same.

BACKGROUND

Camera modules are widely used in various types of camera devices. The camera module usually includes a printed circuit board, a holder disposed on the printed circuit board, a voice coil motor fixed to the holder, and a lens fixed to the holder. The printed circuit board is electrically connected to the voice coil motor by a soldering process. However, the soldering is performed at a relatively high temperature, such a soldering process may be difficult to incorporate in an industrialized production line.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
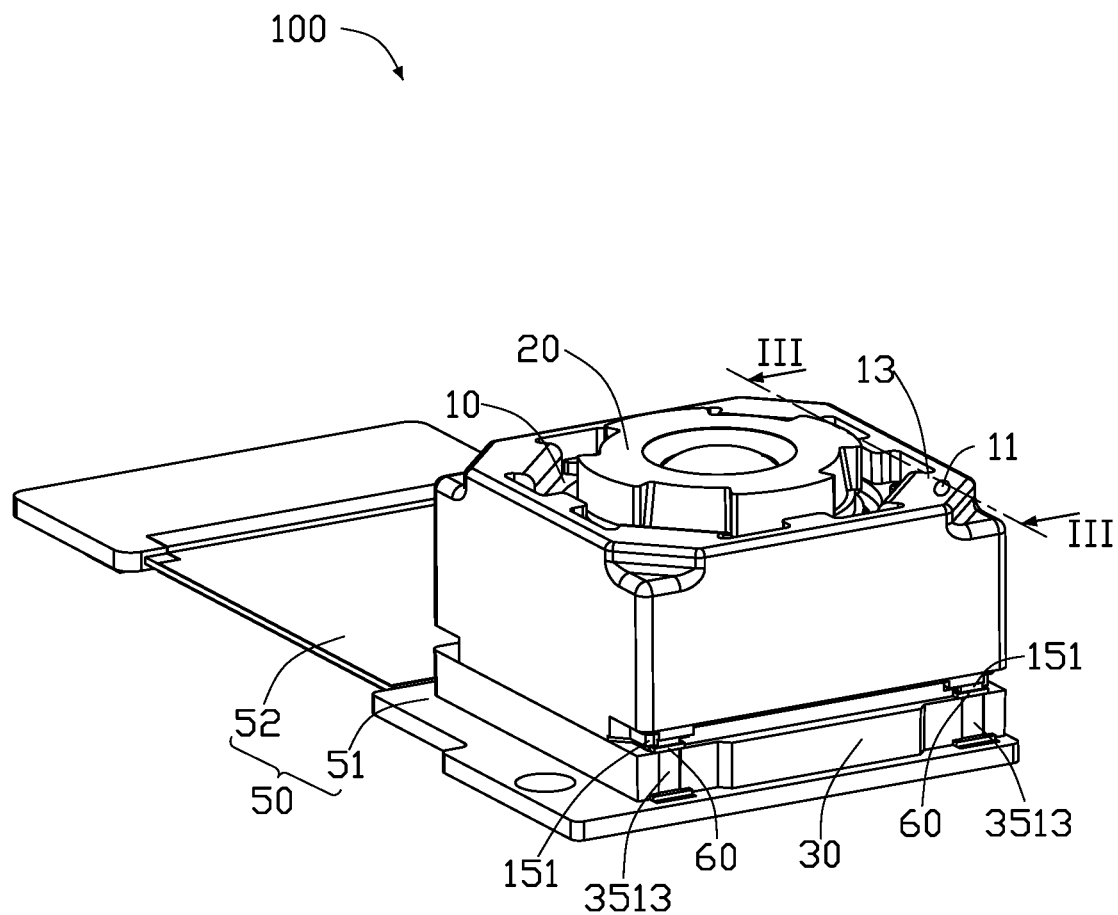
FIG. 1 is a perspective view of a camera module according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
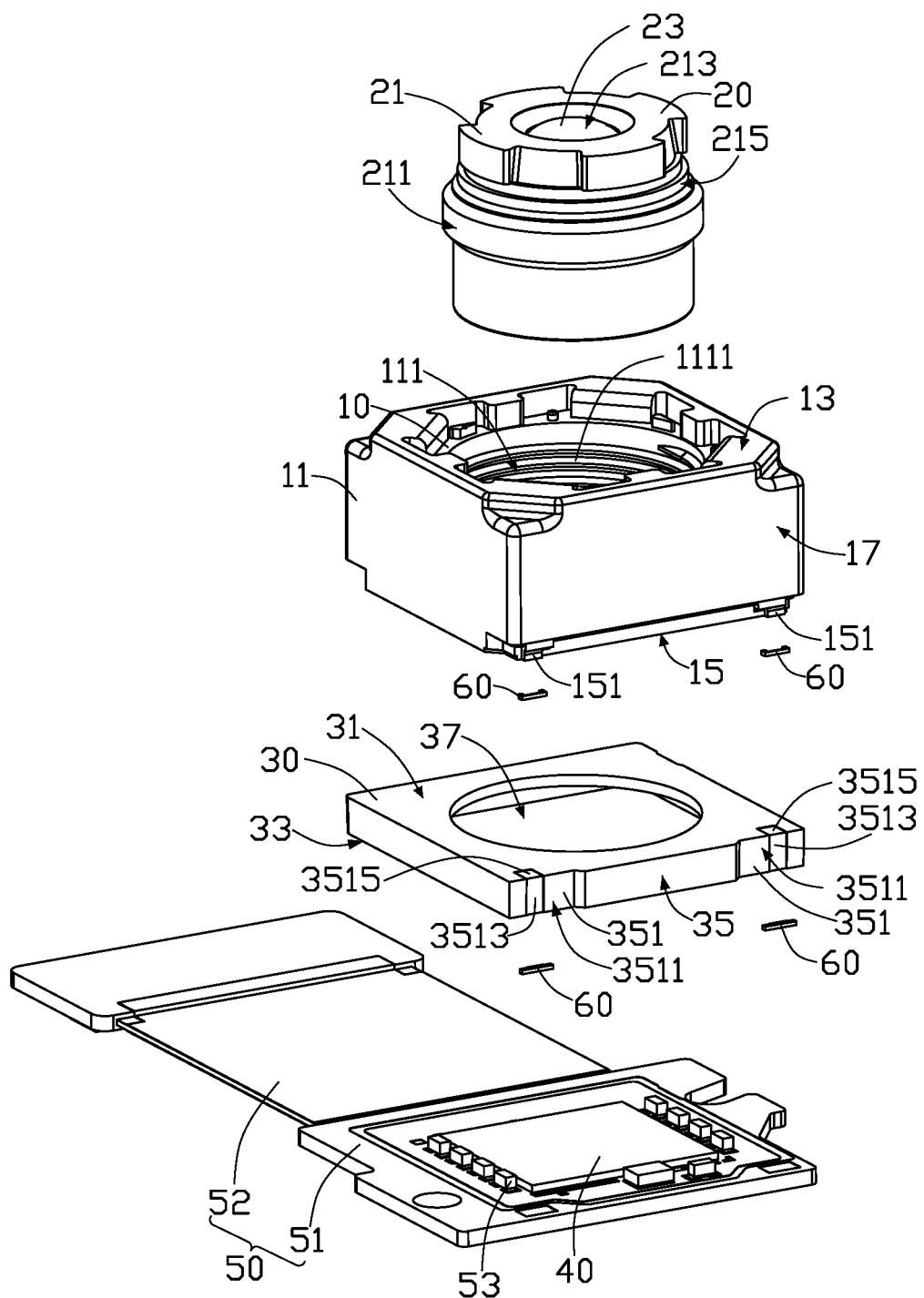
FIG. 2 is an exploded view of the camera module of FIG. 1.
Figure 3:
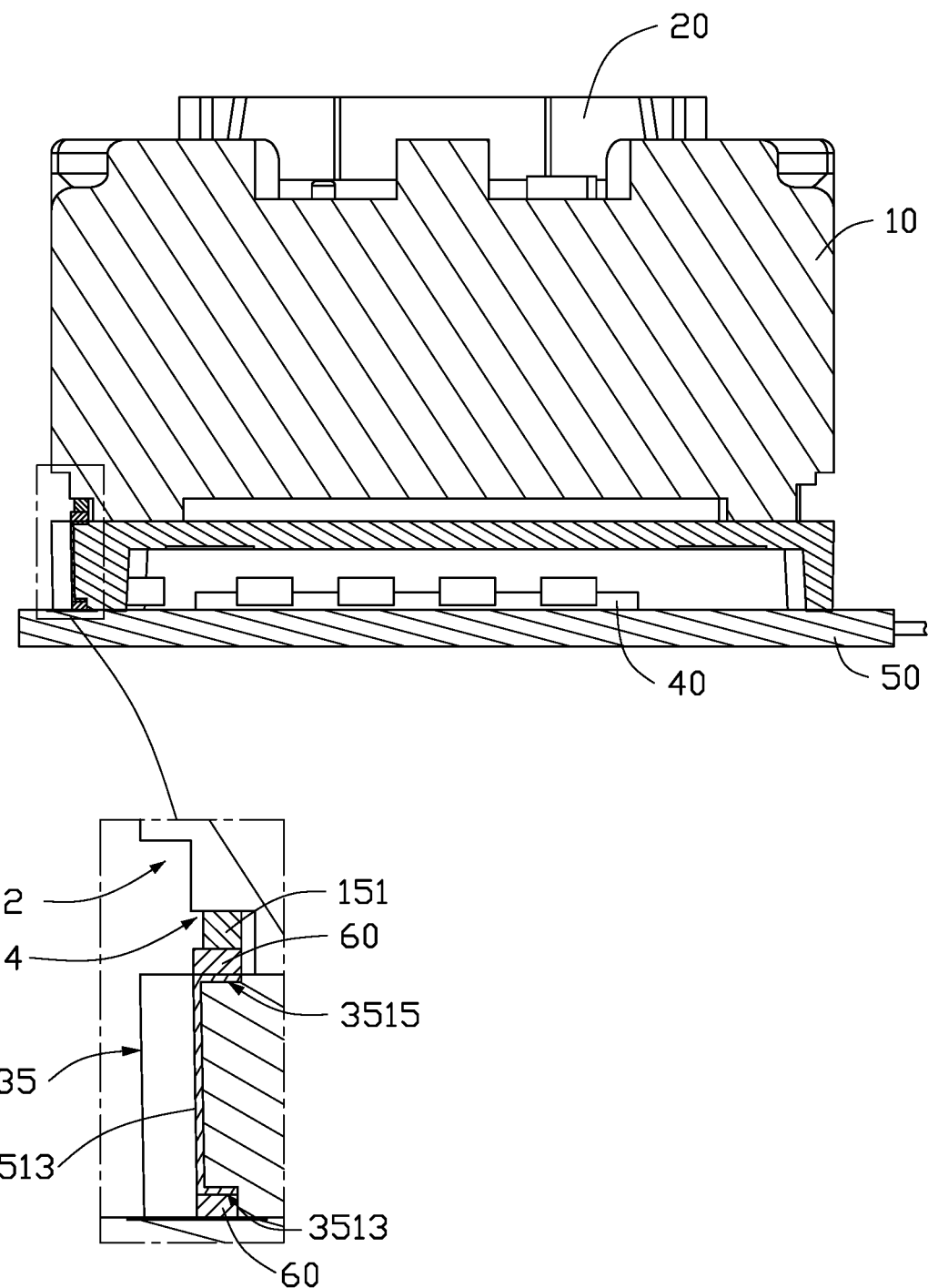
FIG. 3 is a cross-section view along line of FIG. 1.

FIGS. 1-3 show a camera module 100 of the present disclosure. The camera module 100 includes a lens driver 10, a holder 30, and a printed circuit board 50. The lens driver 10 is mounted on the holder 30. The holder 30 is mounted on the printed circuit board 50. The lens driver 10 includes at least one pin 151. The pin 151 extends from the lens driver 10 to the holder 30. The holder 30 includes at least one conductive layer 3513 (shown in FIG. 2). The conductive layer 3513 corresponds to the pin 151. The conductive layer 3513 includes a first end 3515 and a second end 3517 opposite to the first end 3515 (shown in FIG. 3).

The camera module 100 further includes at least two conductive adhesives 60. One of the two conductive adhesives 60 connects the pin 151 to the first end 3515 of the conductive layer 3513, the other one of the two conductive adhesives 60 connects the second end 3517 of the conductive layer 3513 to the printed circuit board 50, that makes the conductive layer 3513 electrically connect to the printed circuit board 50.

The conductive adhesive 60 includes a resin matrix and conductive filler. The resin matrix may be selected from at least one of epoxy resin, phenolic resin, and polyurethane. The conductive filler is selected from at least one gold powder, silver powder, copper powder, aluminum powder, zinc powder, iron powder, and nickel powder.

The conductive layer 3513 may be made of a material selected from one of nickel, gold, copper, and alloy.

The conductive layer 3513 is formed by laser direct structuring (LDS) or by an injection molding process.

The lens driver 10 may be a voice coil motor (VCM) or an optical image stabilization element (OIS) for implementing an autofocus function or an autofocus and anti-shake function.

Referring to FIGS. 2 and 3, the holder 30 includes an upper surface 31, a lower surface 33 opposite to the upper surface 31, and a plurality of first side surfaces 35 perpendicularly connected to the upper surface 31 and the lower surface 33. The first side surfaces 35 extend from the upper surface 31 to the lower surface 33. At least one first groove 351 is formed from at least one of the first side surfaces 35 to the interior of the holder 30. The first groove 351 includes a first bottom surface 352 away from the first side surface 35 corresponding to the first groove 351. The conductive layer 3513 is formed on the first bottom surface 352 of the first groove 351 along an extending direction of the first side surfaces 35.

The conductive layer 3513 on the first bottom surface 352 of the first groove 351 extends to the upper surface 31 to form the first end 3515. A second groove 353 is formed from one the first side surfaces 35 to the interior of the holder 30. The second groove 353 abuts against the lower surface 33. The second groove 353 includes a top surface 354. The top surface 354 abuts against and is parallel with the lower surface 33. The conductive layer 3513 on the first bottom surface 352 of the first groove 351 extends to the top surface 354 to form the second end 3517. The conductive adhesives 60 connecting the second end 3517 to the printed circuit board 50 are received in the second groove 353.

An insulating adhesive layer (not shown) is formed on one side of the conductive layer 3513 abutting the first side surface 35. The insulating adhesive layer prevents the conductive layer 3513 from conducting to other electronic devices and makes a stable electrical connection between the lens driver 10 and the printed circuit board 50.

The lens driver 10 includes a first surface 13 away from the holder 30, a second surface 15 facing the holder 30, and a plurality of second side surfaces 17. The second surface 15 is formed on the upper surface 31 of the holder 30. The second surface 15 is opposite to the first surface 13. The second side surfaces 17 are perpendicular to the first surface 13 and the second surface 15. A third groove 12 is formed from one of the second side surfaces 17 to the interior of the lens driver 10. The third groove 12 abuts against the second surface 15 and corresponds to the first groove 351. The third groove 12 includes a second bottom surface 121 away from the second side surfaces 17. A fourth groove 14 is formed from the second bottom surface 121 of the third groove 12 to the interior of the lens driver 10. The pin 151 and the conductive adhesive 60 connecting to the first end 3515 of the conductive layer 3513 are both received in the fourth groove 14.

In at least one embodiment, the pin 151 is in a shape of a flat strip. In other embodiments, the pin 151 may have other shapes such as a cylinder shape, a prism shape, and the like. Quantity of the pin 151 may be determined according to actual conditions.

Referring to FIGS. 1-2, the camera module 100 further includes a lens 20 and a sensor 40. The lens 20 is received in the lens driver 10. The sensor 40 is mounted on the printed circuit board 50 and is electrically connected to the printed circuit board 50. The sensor 40 is received in the holder 30 and is opposite to the lens 20.

In at least one embodiment, the lens driver 10 includes a receiving groove 111 formed from the first surface 13 to the second surface 15. Some internal threads 1111 are formed on inner wall of the receiving groove 111. The lens 20 is received in the receiving groove 111.

The lens 20 is substantially cylindrical and includes a lens barrel 21 and an ophthalmic lens 23 received in the lens barrel 21. An optical hole 213 is defined in the lens barrel 21. The optical hole 213 runs through the lens barrel 21. The optical hole 213 has an axis in line with that of the ophthalmic lens 23. Some external threads 215 are formed on external wall of the lens barrel 21. The external threads 215 mesh with the internal threads 1111 to fix the lens barrel 21 in the receiving groove 111.

In at least one embodiment, the lens driver 10 is mounted on the holder 30 by a thermosetting adhesive (not shown). The holder 30 is mounted on the printed circuit board 50 by a thermosetting adhesive (not shown). The sensor 40 is mounted on the printed circuit board 50 by a thermosetting adhesive (not shown).

A through hole 37 is defined in the middle portion of the holder 30. The through hole 37 extends from the upper surface 31 to the bottom surface 33.

The sensor 40 is received in the through hole 37 and is opposite to the lens 20 to convert light to electrical signals. The sensor 40 may be a charge coupled device (CCD) sensor or a complementary metal oxide sensor.

The printed circuit board 50 includes two bearing portions 51 and a connecting portion 52 between the two bearing portions 51. A plurality of electronic components 53 are mounted on the bearing portions 51. The bearing portion 51 is connected to the second end 3517 of the conductive layer 3513 by the conductive adhesive 60.

The printed circuit board 50 may be a ceramic substrate, a flexible printed circuit board, a rigid printed circuit board, a rigid-flex printed circuit board, or the like. In at least one embodiment, the printed circuit board 50 is a rigid-flex printed circuit board.

Figure 4:
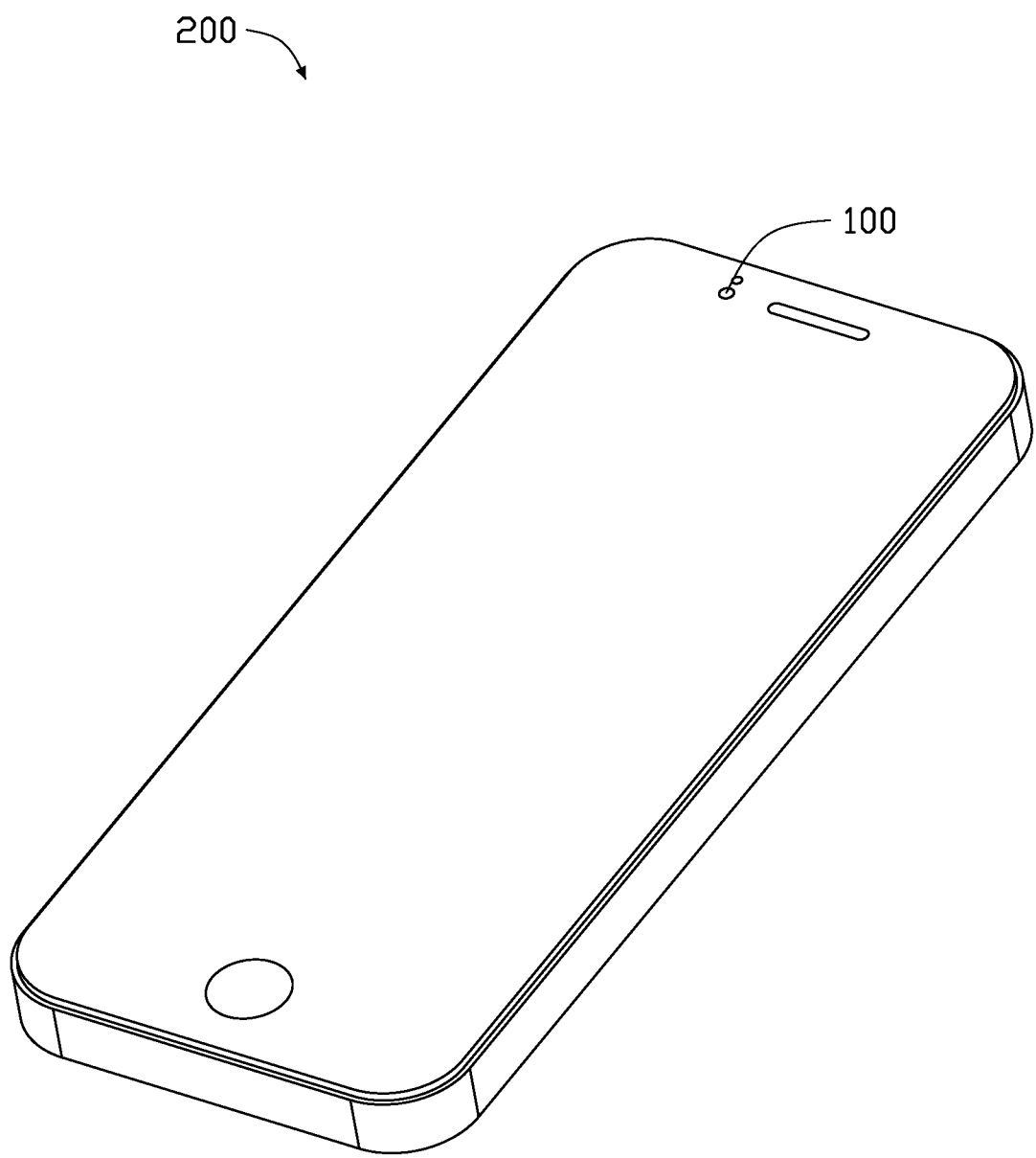
FIG. 4 is a perspective view of an electronic device with the camera module of FIG. 1.

FIG. 4 show an electronic device 200 of the present disclosure, the electronic device 200 includes the camera module 100. The electronic device 200 may be a smart phone, a tablet computer, personal digital assistant, or the like.

In the camera module 100, the holder 30 is mounted on the printed circuit board 50 through the conductive layer 3513 and the conductive adhesive 60, thus the holder 30 of the camera module 100 is not mounted on the printed circuit board 50 by solder or a soldering process, thereby facilitating industrialized assembly line may be utilized in manufacture.

The embodiments shown and described above are only examples. Many details are often found in the art such as the other features of a camera module facilitating industrialized assembly line and an electronic device with the camera module. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A camera module facilitating industrialized assembly line comprising:
   a lens driver; the lens driver comprising at least one pin;
   a holder; the lens driver being mounted on the holder, the pin extending from the lens driver to the holder, the holder comprising at least one conductive layer corresponding to the pin; the conductive layer comprising a first end and a second end opposite to the first end; the holder comprises an upper surface, a lower surface opposite to the upper surface, and a plurality of first side surfaces each perpendicularly connected to the upper surface and the lower surface; each of the plurality of first side surfaces extends from the upper surface to the lower surface; at least one first groove is formed from one of the first side surfaces to an interior of the holder; the first groove comprises a first bottom surface away from the first side surfaces; and the conductive layer is formed on the first bottom surface of the first groove along an extending direction of the first side surfaces;
   a printed circuit board, the holder being mounted on the printed circuit board; and
   at least two conductive adhesives; one of the conductive adhesives connecting the pin to the first end of the conductive layer, another one of the conductive adhesives connecting the second end of the conductive layer to the printed circuit board, thereby electrically connecting the conductive layer the printed circuit board.

2. The camera module of claim 1, wherein the conductive layer on the first bottom surface of the first groove extends to the upper surface to form the first end.

3. The camera module of claim 2, wherein a second groove is formed from one of the first side surfaces to the interior of the holder, the second groove abuts against the lower surface of the holder; the second groove comprises a top surface, the top surface abuts against and is parallel with the lower surface of the holder, the conductive layer on the first bottom surface of the first groove extends to the top surface to form the second end, the conductive adhesives connecting the second end to the printed circuit board is received in the second groove.

4. The camera module of claim 3, wherein the lens driver comprises a first surface away from the holder, a second surface facing the holder, and a plurality of second side surfaces, the second surface is formed on the upper surface of the holder, the second surface faces the first surface, each of the plurality of second side surfaces is perpendicular to each of the first surface and the second surface, a third groove is formed from one of the second side surfaces to an interior of the lens driver, the third groove abuts against the second surface and corresponds to the first groove, the third groove comprises a second bottom surface away from the second side surfaces.

5. The camera module of claim 4, wherein a fourth groove is formed from the second bottom surface of the third groove to the interior of the lens driver, each of the pin and the conductive adhesive connecting to the first end of the conductive layer are received in the fourth groove.

6. The camera module of claim 1, wherein the conductive layer is made of a material selected from one of nickel, gold, copper, and alloy.

7. The camera module of claim 4, wherein the camera module further comprises a lens and a sensor, the lens is received in the lens driver, the sensor is mounted on the printed circuit board and is electrically connected to the printed circuit board, and the sensor is received in the holder and is opposite to the lens.

8. The camera module of claim 7, wherein the lens driver is a voice coil motor or an optical image stabilization element, the lens driver comprises a receiving groove formed from the first surface to the second surface, and the lens is received in the receiving groove.

9. An electronic device comprising:
a camera module facilitating industrialized assembly lines comprising:
a lens driver; the lens driver comprising at least one pin;
a holder; the lens driver being mounted on the holder, the pin extending from the lens driver to the holder, the holder comprising at least one conductive layer corresponding to the pin; each of the conductive layer comprising a first end and a second end opposite to the first end; the holder comprises an upper surface, a lower surface opposite to the upper surface, and a plurality of first side surfaces perpendicularly connected to the upper surface and the lower surface; the plurality of first side surfaces extends from the upper surface to the lower surface; at least one first groove is formed from one of the first side surfaces to the interior of the holder; the first groove comprises a first bottom surface away from the first side surfaces; and the conductive layer is formed on the first bottom surface of the first groove along an extending direction of the first side surfaces;
a printed circuit board, the holder being mounted on the printed circuit board; and
at least two conductive adhesives; one conductive adhesive connecting the pin to the first end of the conductive layer, the other one conductive adhesive connecting the second end of the conductive layer to the printed circuit board, that makes the conductive layer electrically connect to the printed circuit board.

10. The camera module of claim 9, wherein the conductive layer on the first bottom surface of the first groove extends to the upper surface to form the first end.

11. The camera module of claim 10, wherein a second groove is formed from one of the first side surfaces to the interior of the holder, the second groove abuts against the lower surface of the holder; the second groove comprises a top surface, the top surface abuts against and is parallel with the lower surface of the holder, the conductive layer on the first bottom surface of the first groove extends to the top surface to form the second end, the conductive adhesives connecting the second end to the printed circuit board is received in the second groove.

12. The camera module of claim 11, wherein the lens driver comprises a first surface away from the holder, a second surface facing the holder, and a plurality of second side surfaces, the second surface is formed on the upper surface of the holder, the second surface faces the first surface, each of the plurality of second side surfaces is perpendicular to each of the first surface and the second surface, a third groove is formed from one of the second side surfaces to an interior of the lens driver, the third groove abuts against the second surface and corresponds to the first groove, the third groove comprises a second bottom surface away from the second side surfaces.

13. The camera module of claim 12, wherein a fourth groove is formed from the second bottom surface of the third groove to the interior of the lens driver, each of the pin and the conductive adhesive connecting to the first end of the conductive layer are both received in the fourth groove.

14. The camera module of claim 9, wherein the conductive layer is made of a material selected from one of nickel, gold, copper, and alloy.

15. The camera module of claim 12, wherein the camera module further comprises a lens and a sensor, the lens is received in the lens driver, the sensor is mounted on the printed circuit board and is electrically connected to the printed circuit board, and the sensor is received in the holder and is opposite to the lens.

16. The camera module of claim 15, wherein the lens driver is a voice coil motor or an optical image stabilization element, the lens driver comprises a receiving groove formed from the first surface to the second surface, and the lens is received in the receiving groove.

* * * * *